(12) United States Patent
Biana (10) Patent No.: US 8,505,480 B2
(45) Date of Patent: Aug. 13, 2013

(54) PLASMA SYSTEM

(75) Inventor: Ricardo Enrique Biana, Buenos Aires (AR)

(73) Assignee: Alytus Corporation S.A., Montevideo (UG)

( * ) Notice: Subject to any disclaimer, the term of this patent is extended or adjusted under 35 U.S.C. 154(b) by 420 days.

(21) Appl. No.: 12/921,952

(22) PCT Filed: Mar. 12, 2008

(86) PCT No.: PCT/EP2008/001967
§ 371 (c)(1),
(2), (4) Date: Oct. 22, 2010

(87) PCT Pub. No.: WO2009/112053
PCT Pub. Date: Sep. 17, 2009

(65) Prior Publication Data
US 2011/0030617 A1    Feb. 10, 2011

(51) Int. Cl.
*C23C 16/509* (2006.01)
*C23C 16/50* (2006.01)
*C23C 16/455* (2006.01)

(52) U.S. Cl.
USPC .................. 118/723 E; 118/723 R; 118/715

(58) Field of Classification Search
None
See application file for complete search history.

(56) References Cited

U.S. PATENT DOCUMENTS

| | | | |
|---|---|---|---|
| 4,764,398 A * | 8/1988 | Croitoru et al. | 427/237 |
| 4,766,091 A * | 8/1988 | Ohtoshi et al. | 438/482 |
| 5,296,011 A * | 3/1994 | Aikawa et al. | 65/423 |
| 5,322,568 A * | 6/1994 | Ishihara et al. | 118/715 |
| 5,374,314 A * | 12/1994 | Babacz | 118/723 MP |
| 5,378,510 A * | 1/1995 | Thomas et al. | 427/563 |
| 5,391,232 A * | 2/1995 | Kanai et al. | 118/715 |
| 6,112,695 A * | 9/2000 | Felts | 118/723 E |
| 6,158,382 A * | 12/2000 | Segi et al. | 118/723 E |
| 6,189,485 B1 * | 2/2001 | Matsuda et al. | 118/723 E |
| 6,194,835 B1 * | 2/2001 | Liehr | 315/111.21 |
| 7,052,736 B2 * | 5/2006 | Wei et al. | 427/230 |
| 7,300,684 B2 * | 11/2007 | Boardman et al. | 427/249.7 |
| 7,608,151 B2 | 10/2009 | Tudhope et al. | |
| 8,029,875 B2 * | 10/2011 | Wei et al. | 427/570 |

FOREIGN PATENT DOCUMENTS

| | | |
|---|---|---|
| GB | 2030180 A | 4/1980 |
| JP | 62170477 A | 7/1987 |
| JP | 6326373 A | 2/1988 |
| WO | 2009112053 A1 | 9/2009 |

OTHER PUBLICATIONS

Foreign communication from a priority application—International Search Report, PCT/EP2008/001967, Nov. 14, 2008, 3 pages.

* cited by examiner

*Primary Examiner* — Jeffrie R Lund
*Assistant Examiner* — Aiden Lee
(74) *Attorney, Agent, or Firm* — Conley Rose, P.C; Rodney B. Carroll

(57) ABSTRACT

System and technique for plasma enhanced chemical deposition (PECVD) wherein selective surfaces of tubular substrates may be treated to deposit thin films of a desired matter, wherein one of the electrodes employed in the plasma system is conformed by the substrate or workpiece without the need of bulky plasma reactors.

8 Claims, 5 Drawing Sheets

PLASMA SYSTEM

CROSS-REFERENCE TO RELATED APPLICATIONS

This application is a filing under 35 U.S.C. 371 of International Application No. PCT/EP2008/001967 filed Mar. 12, 2008, entitled "Plasma System," which application is incorporated by reference herein in its entirety.

BACKGROUND OF THE INVENTION

The present invention relates to the field of film depositions by use of plasma and more particularly refers to a new technique and system for plasma enhanced chemical deposition (PECVD) wherein selective surfaces of tubular substrates may be treated to deposit thin films of a desired matter with a simple straightforward inventive system wherein one of the electrodes employed in the plasma system is conformed by the same substrate or workpiece without the need of bulky plasma reactors.

Plasma Enhanced Chemical Vapor Deposition (PECVD) is a process based in the use of an ionized gas generally named as plasma. The plasma is any gas in which a significant percentage of the atoms or molecules are ionized. Plasma is a state of matter distinct from common gases and it has unique properties. The term "ionized" refers to presence of one or more free electrons, which are not bound to an atom or molecule. The free electric charges make the plasma electrically conductive so that it responds strongly to electric, magnetic, and electromagnetic fields.

Different types of plasma may be formed by heating and ionizing a gas, stripping electrons away from atoms, thereby enabling the positive and negative charges to move more freely. The properties of plasma allow one to carry out a process, namely the PECVD, to deposit thin films from a gas state (vapour) to a solid state on some substrate such as a workpiece. Plasma deposition is generally carried out under RF (Radio frequency), AC (Alternating current) frequency or DC (Direct current) discharge between two electrodes where in-between place is filled with the reacting gases. The substrate is exposed to these reacting gases and the deposition results in a film chemically adhered to, or integrated to the surface of the substrate. The plasma is normally more positive than any object it is in contact with, as otherwise a large flux of electrons would flow from the plasma to the object. The voltage across the plasma and the objects it contacts is normally dropped across a thin sheath region. Ionized atoms or molecules that diffuse to the edge of the sheath region feel an electrostatic force and are accelerated towards the neighbouring surface. Thus all surfaces exposed to plasma receive energetic ion bombardment.

Several types of plasma reactors are known in the art and all of them are basically comprised of a bulky closed vacuum chamber with two electrodes installed therein. The electrodes are respectively connected to opposite electrical charges through respective connections from outside the closed vacuum chamber. A reactor may be operated by direct-current (DC) discharge which can be created between the two conductive electrodes, and may be suitable for deposition of conductive materials. It is also possible to excite a capacitive discharge by applying an alternating-current (AC) or radio-frequency (RF) signal between an electrode and the conductive walls of a reactor chamber, or between two cylindrical conductive electrodes facing one another. The kind of reactor will depend on the kind of pieces to be subject to treatment.

The chamber has several ports to receive the process gases and precursor matters necessary for the chemical reaction under either an electromagnetic, electrical, or RF field. The plasma is generated inside the vacuum chamber and the substrate is located into the vacuum chamber to be exposed to the plasma and for receiving the matter as a deposition to form the desired film cover or lining. Vacuum chambers may be small or large depending of the pieces that are to be inserted therein but, generally, bulky chambers are involved in order to have enough capacity to all kind of pieces. Always, the entire piece inside the chamber is exposed to the plasma and deposition will be done in all the exposed surfaces of the workpiece.

It is a frequent concern that certain bulky pieces can not be treated because no available plasma reactors are found and designing and manufacturing a special reactor for a determined type of workpiece may be not economically viable. Another concern is that plasma causes film deposition all over the surfaces of the workpiece into the vacuum chamber but, in some cases, deposition is desired for only some parts or surfaces of the substrate. For special works the deposition may be desired in only selective surfaces of the piece such as the inner surface of a tube, pipe or conduit, for example. If a pipe is introduced in the vacuum chamber all the surfaces thereof will be covered by the deposition film, while deposition may not be needed at the outer surface of the tube. Generally, the inner surface of a pipe is needed of treatment. A clear example is the recycling of used pipes or the protection of new pipes in any industry and particularly in the oil field. Considering the sizes of involved pipes no plasma chambers are easily available for that service.

Under the above circumstances it would be very convenient to have a new technique and system for carrying out a PECVD in tubular pieces, either of small and large sizes as well as for obtaining a deposition in only selective parts of the piece under treatment, without the need of a bulky system and stationary installations.

BRIEF SUMMARY OF THE INVENTION

It is therefore an object of the invention to provide a new equipment or system that is simple, straightforward, and economically convenient for plasma deposition in substrates and workpieces that may require large room and/or selective deposition.

It is still another object of the present invention to provide a new system and technique for special works such as when the deposition is for only selective surfaces of the piece such as only the inner surface of a pipe or conduit, for the recycling and/or protection thereof, in fields of the industry, for example, the oil field.

It is a further object of the present invention to provide a new system and technology for treating a desired surface of tubular pieces, such as pipes, tubing, conduits, barrels, drums, containers, tanks, and the like with at least one open end, without the need of bulky chambers and stationary installations.

It is a further object of the present invention to provide a new system and technology for treating of large tubing, such as conduits, pipes and casings, in the oil industry, wherein the system is small and portable.

It is a further object of the present invention to provide a system and technique for plasma enhanced chemical deposition (PECVD) wherein selective surfaces of tubular substrates may be treated to deposit thin films of a desired matter, wherein the vacuum chamber and one of the electrodes employed in the plasma system is conformed by the substrate or workpiece without the need of bulky plasma reactors.

It is a further object of the present invention to provide a plasma system for plasma-enhanced chemical vapor deposition, the system comprising a vacuum chamber, at least two electrodes, a substrate or workpiece, and a matter to be ionized for depositing onto at least one desired surface of the substrate, wherein the substrate comprises a tubular workpiece having two ends, with at least one of the two ends being an open end closed by a removable end cap in a manner that the vacuum chamber is defined by the workpiece and the cap, and wherein the work piece defines one of the electrodes with the other one of the electrodes being extended through the end cap and into the workpiece, and with at least one desired surface of the substrate being defined by an inner surface of the tubular workpiece.

The above and other objects, features and advantages of this invention will be better understood when taken in connection with the accompanying drawings and description.

BRIEF DESCRIPTION OF THE DRAWINGS

The present invention is illustrated by way of example in the following drawings.

DETAILED DESCRIPTION OF THE INVENTION

Figure 1:
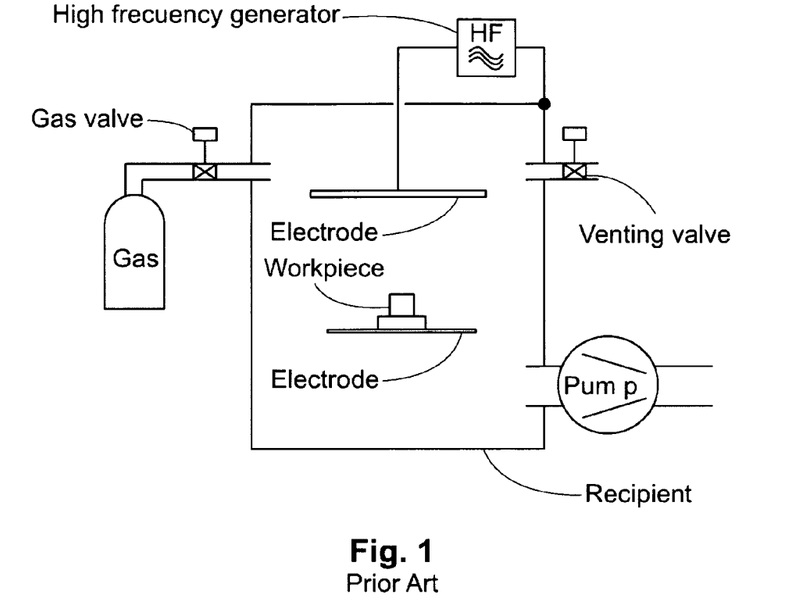
FIG. 1 shows a schematic representation of a plasma system according to the prior art.
Figure 2:
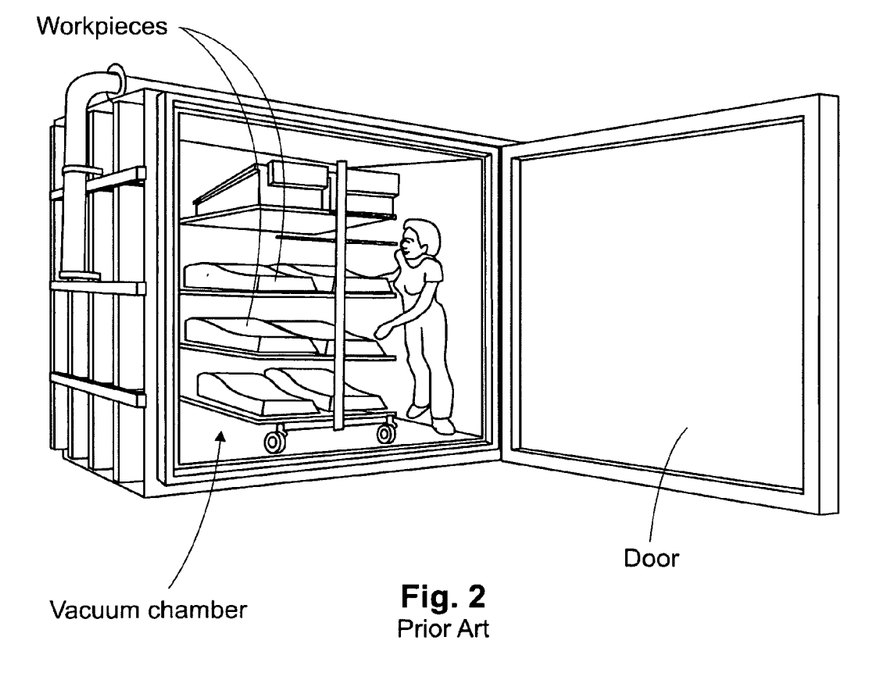
FIG. 2 shows a perspective view of a plasma reactor and vacuum chamber for large workpieces, also according to the prior art.

Now referring in detail to the drawings, reference will be made first to some prior art systems as shown in FIGS. 1 and 2. A very well known plasma system for Plasma Enhanced Chemical Vapor Deposition (PECVD) is schematically illustrated in FIG. 1. The system basically consists of a vacuum chamber defined by a proper container or recipient, for receiving a substrate or workpiece to be subject to the plasma treatment. Two electrodes are located into the chamber wherein the electrodes generate the field conditions for the reaction of the process gases injected into the chamber under the control of gas valves, for example. A vacuum is formed into the chamber by the use of a pump in order to initiate the process to achieve the conditions for the mentioned reaction. The workpiece is heated, the gases are injected, and the field conditions to achieve a plasma region are started. The workpiece is now in condition to be treated. In order to proceed with the plasma treatment to the substrate or workpiece already located into the chamber, the chamber is evacuated by use of the pump. Then, the process gas or gases is/are injected into the chamber and the ignition is commenced by application of the field. Some times, heating of the recipient is done by the use of peripheral heaters not illustrated. For a determined period of time the plasma will deposit the precursor matter onto the workpiece and when the time has lapsed according to a designed treatment program the chamber is vented and the treated workpiece removed.

The above scheme is basically found in all kind of plasma systems which can be of several types depending of the shape, size and other parameters of the substrate. For example, the recipient of FIG. 1 may house a rotary drum (not shown) designed to contain the substrates or pieces under treatment in the form of bulky material. With the drum rotation the samples move into the drum in order to receive a uniform and complete film deposition. In other types of systems, the electrode into the chamber may be designed to be adapted to the shape of the substrate and, even in another type (not shown), when foils or webs must be treated, the chamber may include a couple of parallel electrodes facing the foil that is arranged in a winding mechanism, all into the vacuum chamber. Another type of system may conform a large recipient, as shown in FIG. 2, with a door closing the entrance to personnel and a large room with a plurality of trays therein to arrange several substrates or workpieces.

In all these cases, the system comprises a container or recipient defining the vacuum chamber the form and size of which will depend on the form and size of the workpiece(s). This may cause the system to be dramatically bulky, as shown in FIG. 2, and to require stationary installations and buildings. For example, if substrates like pipes for the oil industry, casings, drums or tanks must be treated, the recipient for the vacuum chamber should be big and long with the inconveniences of available room and costs this would imply.

The inventor has faced the problem when needing a plasma system for treating large pieces like casing pipes, piping and tubing for the oil industry and other heavy industries with no vacuum chambers easily available for such substrates. Another problem addressed by the inventor was to have a deposition selectively done in pieces wherein not all the parts or surfaces thereof needed to be treated while only selective surfaces were designed to be treated by plasma.

Now, in connection to the present invention, while the present description will make specific reference to the application of the inventive system to cylindrical tubular substrates or pieces, such as tubes, conduits and pipes, it will be readily apparent for any expert in the art that the system may be conformed by any other shape of the workpiece wherein, with the teachings of the invention, at least part of the piece defines at least part of the walls of the vacuum chamber and one of the electrodes of the system.

As shown in FIGS. 3-7, the invention provides a new plasma system for plasma-enhanced chemical vapor deposition (PECVD), preferably employed for treating substrates or workpieces such as tubular pieces and the like. The tubular pieces may comprise pipes, tubing, conduits, tanks, boilers, drums, containers, and the like. While cylindrical or revolution bodies are preferred, the tubular pieces may have any convenient section, such as square sections, polygonal sections, oval sections, including goosenecks and elbows, and the like. Like any conventional plasma system, the new system is comprised basically of a vacuum chamber, at least two electrodes, a substrate or workpiece to be treated, and a matter to be ionized for depositing onto at least one desired surface of the substrate.

According to the invention, in the new system the substrate comprises a tubular workpiece having two ends, with at least one of the two ends being an open end closed by a removable end cap in a manner that the vacuum chamber is defined by the workpiece and the cap, and wherein the work piece defines one of the electrodes with the other one of the electrodes being extended through the end cap and into the workpiece, and with at least one desired surface of the substrate being defined by an inner surface of the tubular workpiece.

Figure 3:
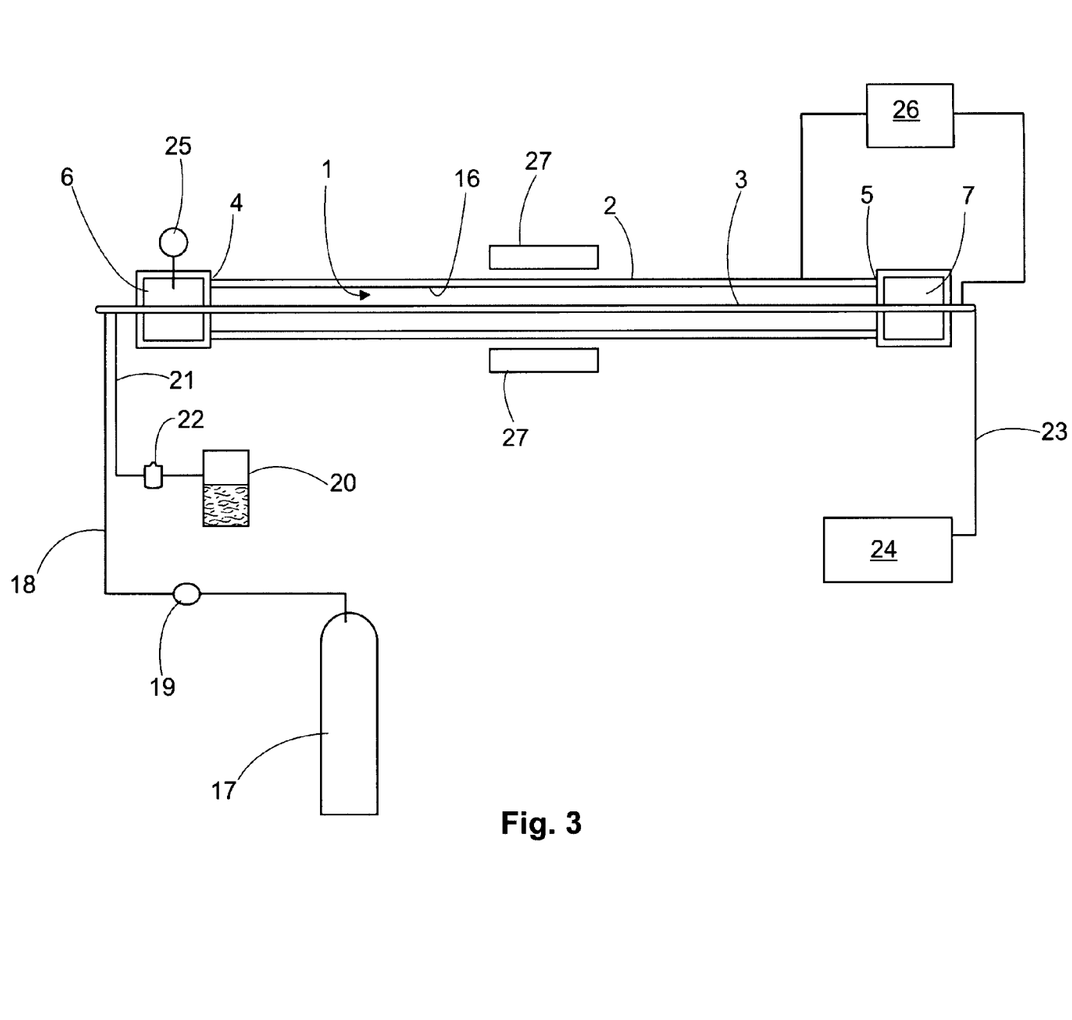
FIG. 3 shows a schematic view of the plasma system according to a preferred embodiment of the invention.
Figure 4:
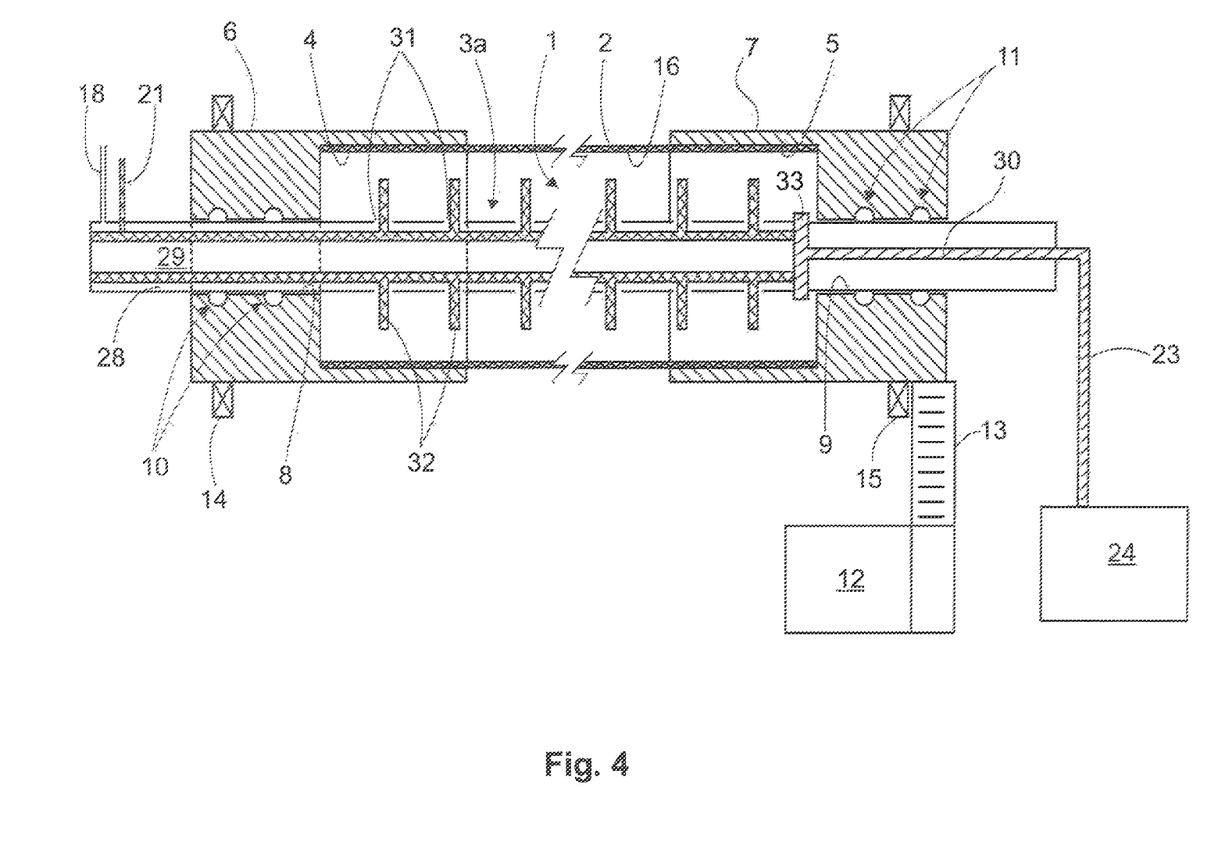
FIG. 4 shows a cross-section view of the plasma system of FIG. 3.
Figure 5:
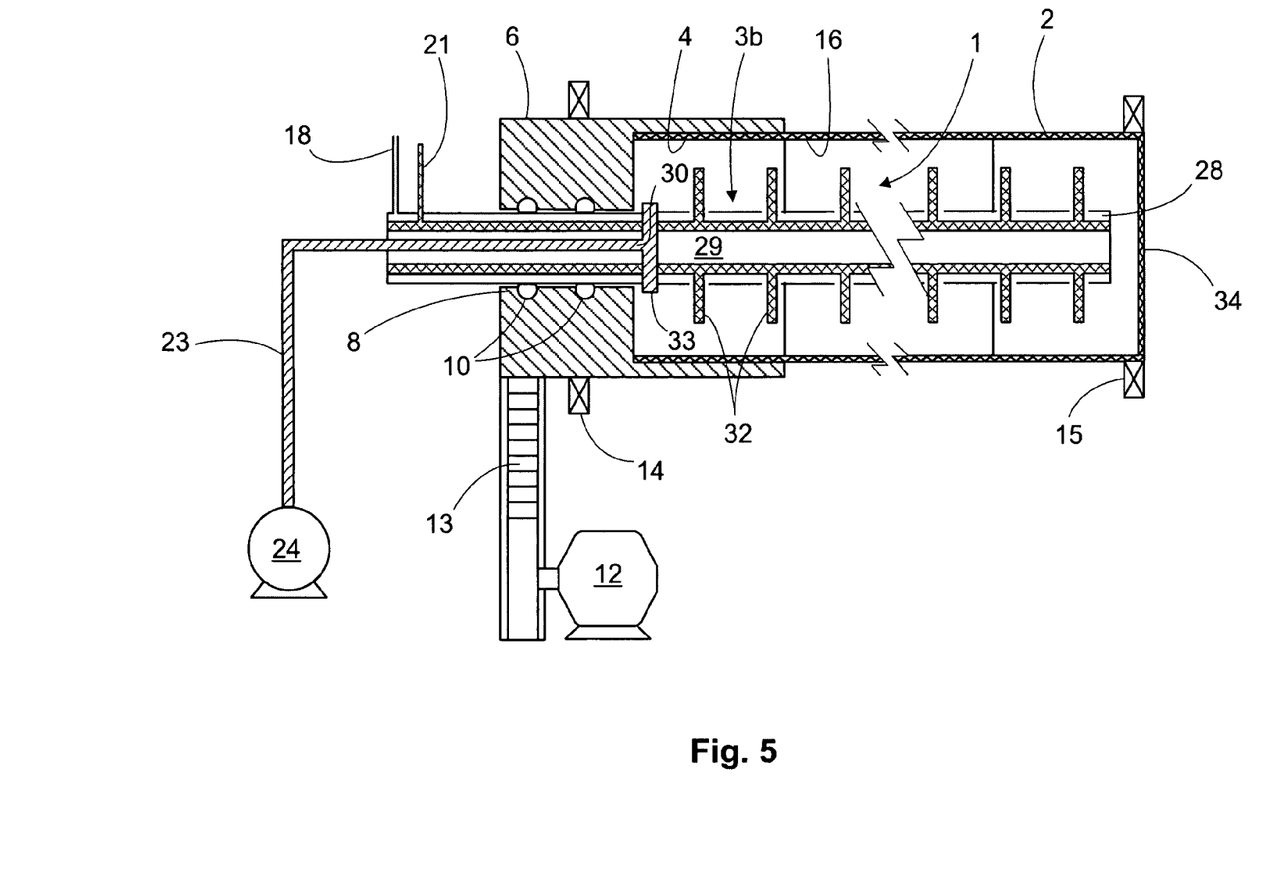
FIG. 5 shows a cross-section view of a plasma system according to another embodiment of the invention.

More particularly, the inventive system, as shown in FIG. 3, comprises a vacuum chamber 1 defined or enclosed at least partially by the substrate or workpiece that comprises a tubular piece 2 and at least two electrodes, wherein one electrode is defined by the substrate or workpiece 2, forming a peripheral electrode, and the other electrode is defined by a central electrode, preferably a central tubular electrode 3. Substrate or tubular workpiece 2 has two ends, namely end 4 and end 5, with both ends being open, as shown in the embodiment of FIG. 4, or one end being partially or entirely closed, as shown in the embodiment of FIG. 5. One pipe will probably have both ends open while a drum, for example, will have one end closed.

Figure 6:
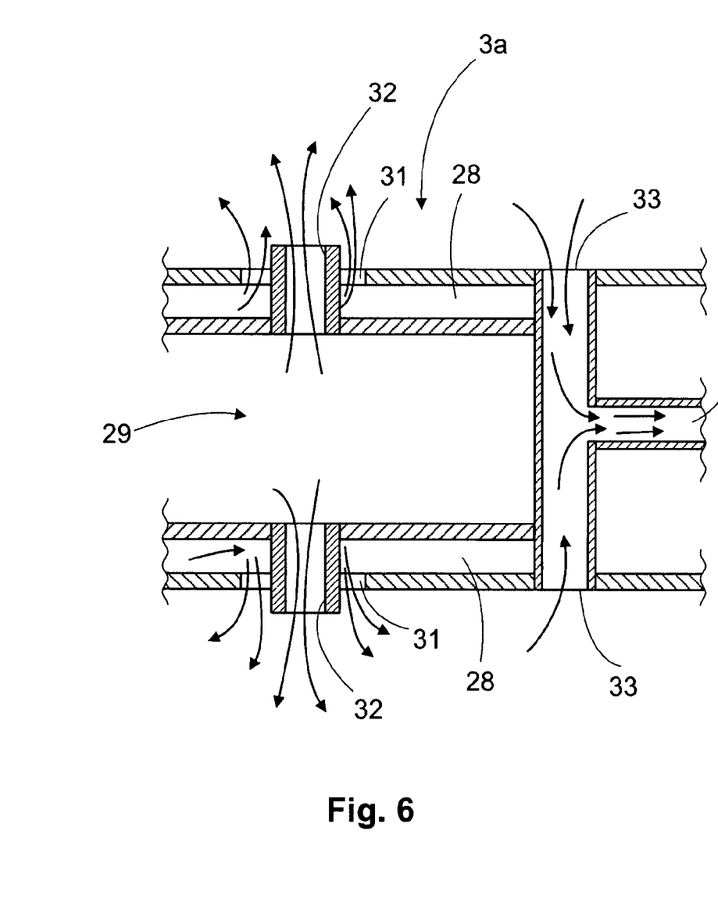
FIG. 6 shows a cross-section view of the central electrode showing in more detail the gas and precursor conduits with the diffusion nozzles thereof as well as the vacuum conduit having the suction ports open into the vacuum chamber, according to the embodiment of FIG. 4.

Reference will now be made to the embodiment of FIG. 4 wherein, both ends 4, 5 will be connected to respective removable end caps 6, 7 in order to keep chamber 1 properly closed to keep vacuum therein and to safely contain the physical-chemical reactions. Thus, according to an important aspect of the invention, the vacuum chamber is defined by the substrate and the caps. Caps 6, 7 may be made of any suitable material electrically non conductive and capable of resisting high temperatures such as 1000° C. Caps 6, 7 may be fixed to ends 4, 5 by any means such as threaded connections, friction connection, etc., and they will be provided with orifices 8, 9 wherein the central electrode may pass through the orifices to have their respective ends outside the vacuum chamber. For clarity purposes, the central electrode of the embodiment of FIG. 4 will be indicated by reference number 3a and the central electrode of embodiment of FIG. 5 will be indicated by 3b and when reference to electrode 3 is made, this will mean that the reference is applicable to either electrode 3a and/or 3b. Sealing means, such as O-rings 10, 11, also may be arranged between orifices 8, 9 and central electrode 3. The assembly of caps and substrate may be rotated by the use of a motor 12 with transmission means 13, such as gears, belts, and the like, with the assembly supported by corresponding bearings, such as ball bearings 14, 15 or the like (FIGS. 5, 6).

Also according to the invention, the central electrode, comprised of a tubular electrode structure, has a plurality of conduits in fluid communication with the vacuum chamber in order to feed process gas and precursor matter into the vacuum chamber for obtaining the necessary reaction to generate the desired deposition onto only inner surface 16 of the tubular substrate. This is a selective deposition achieved by the inventive system. The process gas may be provided by a gas source 17, such as a bottle or tank, via external conduits 18 having flow control devices 19 for administering the gas supply into the vacuum chamber. In like manner, precursor matter may be provided by a precursor matter source 20 via external conduits 21 also having flow control devices 22 for administering the supply into the vacuum chamber. According to the embodiment of FIGS. 3, 4, an external conduit 23 connected to a suction pump 24 is employed to create vacuum into chamber 1. As shown in FIG. 3, a pressure gauge 25 may be provided in at least one of the caps and a field source 26 will be connected to the electrodes 3 and 2 for providing either, high frequency field, micro waves field, pulsing energy field, RF field, CC field, AC field, etc. If heating is necessary for the process, a plurality of heaters 27, of which only two have been illustrated, may also be provided as it is known in the art.

Figure 7:
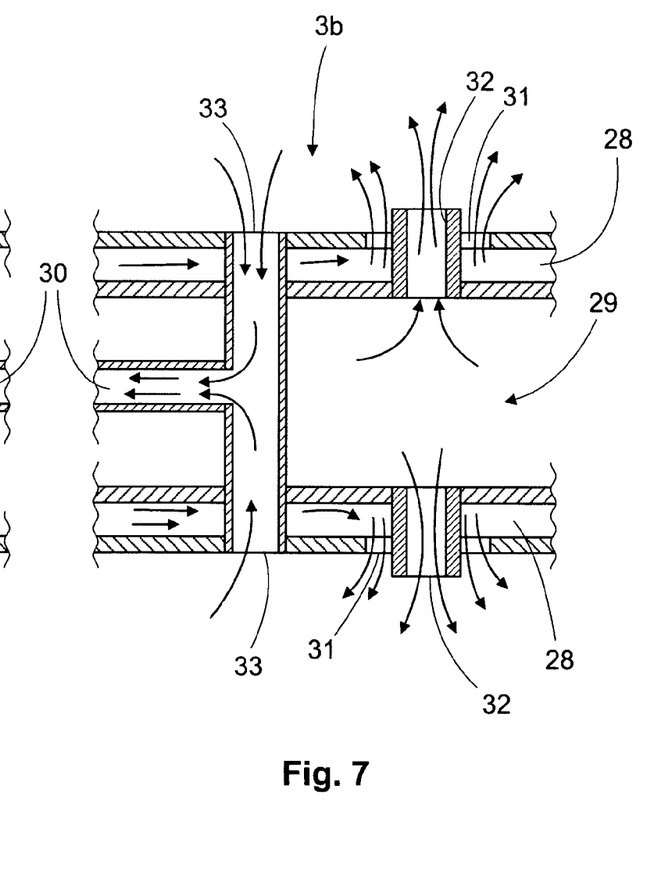
FIG. 7 shows a cross-section view of the central electrode showing in more detail the gas and precursor conduits with the diffusion nozzles thereof, as well as the vacuum conduit having the suction ports open into the vacuum chamber, according to the embodiment of FIG. 5.

The plurality conduits of the tubular electrode comprise at least one gas conduit 28 for conducting process gas via external conduit 18 from gas source 17 into the vacuum chamber, at least one precursor conduit 29 for conducting a precursor matter via external conduit 21 from source 20 into the vacuum chamber and at least one vacuum conduit 30 for generating vacuum into the vacuum chamber by pump 24 via external conduit 23. Generally, either in the embodiment of FIGS. 3, 4 and FIG. 5, the conduits are preferably concentrically arranged in the tubular electrode. Conduits 28, 29 have respective diffusion nozzles 31, 32 open into the vacuum chamber to provide, as indicated in FIGS. 6, 7 by the arrows exiting the nozzles, process gas and precursor matter, respectively. As to the vacuum conduit, the same is provided with at least one suction port 33 also open into the vacuum chamber in order to evacuate the chamber as shown by the arrows entering the ports 33 in FIGS. 6, 7. The tubular electrode has their ends located out of the workpiece to provide the connections between the several conduits into the electrode with the gas and matter sources and pump.

According to another embodiment of the invention, illustrated in FIGS. 5 and 7, tubular substrate may have one end closed, indicated by reference number 34. In this embodiment, only one cap 6 is employed as long as central electrode 3b does not cross end 34 to exit out of the vacuum chamber. The process and system is like the embodiment of FIGS. 3, 4 except that the vacuum conduits 23, 30 and vacuum ports 33 are arranged at left hand side together with the conduits for the process and precursor gases. In both embodiments, central electrode 3 is so designed that a uniform and continuous supply of gases is guaranteed and an enough vacuum values are achieved.

Also according to the invention, the process gas may comprise argon, hydrogen, nitrogen, helium, methane, oxygen, and mixtures of therefore, and the precursor matter may be any gas capable of being ionized, but preferably diclorosilane, silane and oxide, ammonia, nitrogen, titanates, chromates, aluminates, and mixtures thereof. The work piece or substrate 2 may comprise any material such as metals, glass, plastics, ceramics, carbon fibers, and mixtures thereof. The form and kind of pieces may be pipes, tubes, conduits, barrels, drums, spherical containers, etc., and combinations thereof, including goosenecks and elbows.

While preferred embodiments of the present invention have been illustrated and described, it will be obvious to those skilled in the art that various changes and modifications may be made therein without departing from the scope of the invention as defined in the appended claims.

What is claimed is:

1. A plasma system for plasma-enhanced chemical vapor deposition, the system comprising:
   a vacuum chamber,
   at least two electrodes,
   a substrate, and
   a matter to be ionized for depositing onto at least one desired surface of the substrate; and
   wherein the substrate comprises a tubular workpiece having two ends, with at least one of the two ends being an open end closed by a removable end cap in a manner that the vacuum chamber is defined by the workpiece and the cap; and wherein the work piece defines one of the electrodes with the other one of the electrodes being extended through the end cap and into the workpiece, and with at least one desired surface of the substrate being defined by an inner surface of the tubular workpiece; and
   wherein the at least two electrodes comprise a peripheral electrode formed by the tubular workpiece and a central electrode formed by said other one electrode;

wherein the central electrode comprises a tubular electrode having a plurality of conduits in fluid communication to the vacuum chamber; and wherein the plurality conduits of the tubular electrode comprise at least one gas conduit for conducting process gas into the vacuum chamber, at least one precursor conduit for conducting a precursor matter into the vacuum chamber and at least one vacuum conduit for generating vacuum into the vacuum chamber; and wherein each of the gas conduit and the precursor conduit are provided with diffusion nozzles into the vacuum chamber and the vacuum conduit is provided with at least one suction port open into the vacuum chamber.

2. The system of claim 1, wherein the gas conduit, the precursor conduit and the vacuum conduit are concentrically arranged in the tubular electrode.

3. The system of claim 1, wherein the tubular electrode has at least one outer end located out of the workpiece and the outer end includes at least one gas connecting port of the gas conduit, at least one precursor connecting port of the gas conduit and at least one vacuum connecting port of the vacuum conduit, with the at least one gas connecting port connected to a process gas source, the at least one precursor connecting port connected to a precursor matter source and the at least one vacuum connecting port connected to a vacuum pump.

4. The system of claim 3, wherein the process gas is selected from the group consisting of argon, hydrogen, nitrogen, helium, methane, oxygen, and mixtures thereof.

5. The system of claim 3, wherein the precursor matter is selected from the group consisting of dichlorosilane, silane and oxide, ammonia, nitrogen, titanates, chromates, aluminates, and mixtures thereof.

6. The system of claim 3, wherein the substrate is selected from the group consisting of metals, glass, plastics, ceramics, carbon fibers, and mixtures thereof.

7. The system of claim 1, wherein the workpiece is selected from the group consisting of tubes, conduits, barrels, drums, spherical containers and combinations thereof.

8. The system of claim 1, wherein the peripheral electrode formed by the tubular workpiece is a tube with two open ends and the at least one removable end cap comprises one removable end cap closing each open end, and the central electrode extends longitudinally along a center of the tube with the central electrode passing through the end caps in a manner to keep the vacuum chamber closed and to keep an electrical insulation with the caps, with the central electrode having two ends located out of the vacuum chamber.

* * * * *

UNITED STATES PATENT AND TRADEMARK OFFICE
CERTIFICATE OF CORRECTION

PATENT NO. : 8,505,480 B2  Page 1 of 1
APPLICATION NO. : 12/921952
DATED : August 13, 2013
INVENTOR(S) : Ricardo Enrique Biana It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 459 days.

Signed and Sealed this

Fifteenth Day of September, 2015

Michelle K. Lee
*Director of the United States Patent and Trademark Office*